United States Patent [19]

Fitch et al.

[11] Patent Number: 5,451,538
[45] Date of Patent: Sep. 19, 1995

[54] METHOD FOR FORMING A VERTICALLY INTEGRATED DYNAMIC MEMORY CELL

[75] Inventors: Jon T. Fitch; Carlos A. Mazuré; Keith E. Witek, all of Austin, Tex.

[73] Assignee: Motorola, Inc., Schaumburg, Ill.

[21] Appl. No.: 230,409

[22] Filed: Apr. 20, 1994

Related U.S. Application Data

[60] Division of Ser. No. 150,328, Nov. 9, 1993, Pat. No. 5,414,289, which is a continuation of Ser. No. 9,205, Jan. 25, 1993, abandoned, which is a division of Ser. No. 844,038, Mar. 2, 1992, Pat. No. 5,208,172.

[51] Int. Cl.⁶ ............................................ H01L 21/8242
[52] U.S. Cl. ............................................ 487/60; 437/89; 437/915
[58] Field of Search .................. 437/60, 89, 915, 919; 257/302; 148/DIG. 14

[56] References Cited

U.S. PATENT DOCUMENTS

| | | | |
|---|---|---|---|
| 4,530,149 | 7/1985 | Jastrzebski et al. | 437/90 |
| 4,663,831 | 5/1987 | Birrittella et al. | 437/89 |
| 4,764,801 | 8/1988 | McLauglin et al. | 257/588 |
| 4,860,077 | 8/1989 | Reuss et al. | 357/34 |
| 4,902,641 | 2/1990 | Koury, Jr. | 437/915 |
| 4,974,060 | 11/1990 | Ogasawara | 257/302 |
| 4,984,030 | 1/1991 | Sunami et al. | 357/23.6 |
| 5,057,888 | 10/1991 | Fazan et al. | 357/23.6 |
| 5,061,650 | 10/1991 | Dennison et al. | 437/47 |
| 5,066,607 | 11/1991 | Banerjee | 437/52 |
| 5,072,269 | 12/1991 | Hieda | 357/23.6 |
| 5,091,761 | 2/1992 | Hiraiwa et al. | 357/23.6 |
| 5,100,823 | 3/1992 | Yamada | 437/52 |
| 5,100,825 | 3/1992 | Fazan et al. | 437/52 |
| 5,106,775 | 4/1992 | Kaga et al. | 437/52 |
| 5,106,776 | 4/1992 | Shen et al. | 437/52 |
| 5,122,476 | 6/1992 | Fazan et al. | 437/89 |
| 5,128,273 | 7/1992 | Ema | 437/52 |
| 5,281,837 | 1/1994 | Kohyama | 257/302 |

OTHER PUBLICATIONS

"Impact of Surrounding Gate Transistor (SGT) for Ultra-High-Density LSI's", Takato et al; IEEE Trans. on Electron Devices, vol. 38, No. 3, Mar. 1991, pp. 573-577.

A Trench Transistor Cross-Point DRAM Cell; Richardson et al; IEEE IEDM Conference 1985, pp. 714-717.

*Primary Examiner*—Chandra Chaudhari
*Attorney, Agent, or Firm*—Keith E. Witek

[57] ABSTRACT

A vertical transistor (10) has a substrate (12) and a control electrode conductive layer (18), which functions as a control or gate electrode. A sidewall dielectric layer (22) is formed laterally adjacent the control electrode conductive layer (18) and overlying the substrate (12). The conductive layer (18) at least partially surrounds a channel region (30). A vertical conductive region is formed within a device opening wherein a bottom portion of the conductive region is a first current electrode (28). A middle portion of the vertical conductive region is the channel region (30). A top portion of the vertical conductive region is a second current electrode (34). A capacitor (69) is formed overlying and coupled to the vertical transistor (10) in order to form a dynamic random access memory (DRAM) cell.

19 Claims, 5 Drawing Sheets

METHOD FOR FORMING A VERTICALLY INTEGRATED DYNAMIC MEMORY CELL

CROSS REFERENCE TO RELATED APPLICATIONS

Related subject matter may be found in the following copending cases filed of even date herewith:

(1) U.S. Patent Application Serial No. 07/844,088 now abandoned, entitled "A Transistor and Method of Formation and Logic Gates Formed Therefrom" by Fitch et al.; and (2) U.S. Patent application Ser. No. 07/844,037 now U.S. Pat. No. 5,252,849, entitled "A Transistor Useful for Further Vertical Integration and Method of Formation" by Fitch et al..

FIELD OF THE INVENTION

The present invention relates generally to semiconductor technology, and more particularly, to field effect transistors.

BACKGROUND OF THE INVENTION

Planar transistors are often used to fabricate integrated circuits. A planar transistor has a diffused source electrode and a drain electrode separated by a channel region. Overlying the channel region is a gate electrode that is separated from the channel region by a gate oxide. Planar transistors, although used and useful in many integrated circuit applications, are substrate area intensive and consume a large amount of substrate per transistor. In addition, with integrated circuit geometries decreasing into sub-micron ranges, planar transistors have various disadvantages. At smaller geometries and thinner gate oxide thicknesses, well documented problems such as hot carrier injection, leakage currents, isolation, short channel behavior, and channel length variations are major problems in planar transistors.

To overcome some of the disadvantages described above for planar transistors, elevated source and drain transistors, lightly doped drain (LDD) transistors, and other improvements were developed. Although the improvements reduced some of the disadvantages listed above,, the improvements had some undesirable characteristics. The primary undesirable characteristic is the fact that the improved transistors were, in most cases, as area intensive or more area intensive than the planar transistor.

Various approaches have been used to try to reduce transistor surface area and increase transistor packing density while at the same time reducing some of the adverse effects described above. The surrounding gate transistor (SGT) was developed wherein a spacer gate and planar diffusions are used to form a transistor. The SGT reduced some of the disadvantages that affect planar transistors and reduced surface area due to a vertically positioned spacer gate. Topography problems and the geometry of the SGT usually result in source and drain contacts that are difficult to achieve and are difficult to consistently produce using sub-micron technology. In addition, doping of source regions, drain regions, and channel regions via implants can be difficult due to geometry and may require special processing.

In order to further increase circuit density, the thin film transistor (TFT) has been developed, especially for memory applications. Although small memory cell areas can result via the use of TFTs, TFTs are highly resistive and therefore not adequate for all applications.

SUMMARY OF THE INVENTION

The previously mentioned disadvantages are overcome and other advantages achieved with the present invention. The present invention comprises a transistor and a method of formation. In one form, a transistor is formed by providing a substrate having a surface and being of a first conductivity type. A first dielectric layer overlying the substrate, a control electrode conductive layer overlying the, first dielectric layer, and a second dielectric layer overlying the control electrode conductive layer are formed. Portions of each of the first dielectric layer, the control electrode conductive layer, and the second dielectric layer are removed to form both an opening which exposes the surface of the substrate and a sidewall of the control electrode conductive layer. A sidewall dielectric is formed adjacent the sidewall of the control electrode conductive layer. A conductive region is formed within the opening. The conductive region has a first portion of a second conductivity type which functions as a first current electrode. The first portion is laterally adjacent the first dielectric layer and overlies the substrate. The conductive region has a second portion of a first conductivity type functioning as a channel region. The second portion is laterally adjacent the sidewall dielectric, and overlies the first current electrode. The conductive region has a third portion of the second conductivity type functioning as a second current electrode. The third portion is laterally adjacent the second dielectric layer and laterally adjacent the channel region.

The present invention will be more clearly understood from the detailed description below in conjunction with the accompanying drawings.

DESCRIPTION OF THE PREFERRED EMBODIMENT

Figure 1:
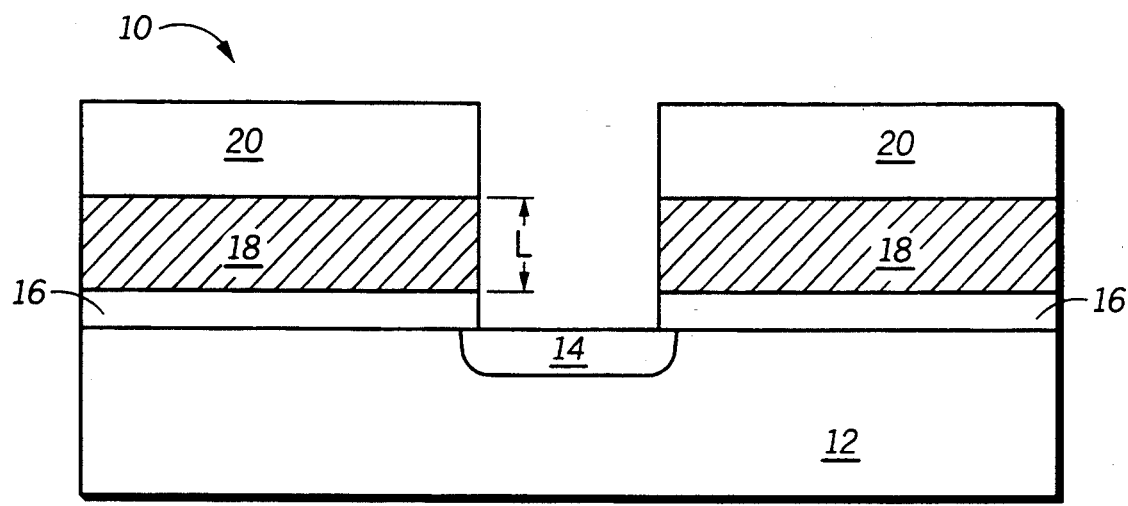
FIGS. 1–4 illustrate, in cross-sectional form, a transistor and method of formation in accordance with the present invention.

Illustrated in FIG. I is a structure suitable for formation of a transistor 10. The transistor 10 has a substrate 12 having a surface and having a first conductivity type. Substrate 12 may be made of silicon, gallium arsenide, silicon on sapphire, epitaxial formations, germanium, germanium silicon, and/or like substrate materials. Preferably, the substrate 12 is made of silicon. A diffusion 14 is formed within the substrate 12. Two methods used to form diffusion 14 are discussed below. A first dielectric layer 16 is formed overlying the substrate 12 and initially overlying the diffusion 14. A control electrode conductive layer 18 is formed overlying the dielectric layer 16. In a preferred form, conductive layer 18 is polysilicon, but conductive layer 18 may be a metal, a salicide or silicide, germanium silicon, or the like. A second dielectric layer 20 is formed overlying the conductive layer 18.

The dielectric layers 16 and 20, and all other dielectrics described herein may vary in physical and chemical composition based upon the function they perform. The dielectric layers described herein may be wet or dry silicon dioxide ($SiO_2$), nitride, tetra-ethyl-ortho-silicate (TEOS) based oxides, boro-phosphate-silicate-glass (BPSG), phosphate-silicate-glass (PSG), boro-silicate-glass (BSG), oxide-nitride-oxide (ONO), tantalum pentoxide ($Ta_2O_5$), plasma enhanced silicon nitride (P-$SiN_x$) and/or the like. Specific dielectrics are noted where a specific dielectric is preferred or required.

A masking layer of photoresist is deposited overlying the dielectric layer 20. The masking layer is conventionally patterned and etched to form a mask opening that exposes a portion of the dielectric layer 20. A portion of the dielectric layer 20 is etched selective to the conductive layer 18 to form an opening in the dielectric layer 20. A portion of the conductive layer 18 is etched selective to the dielectric layer 16 to deepen the opening by etching into conductive layer 18. A portion of the dielectric layer 16 is etched selective to the substrate 12 to further deepen the opening by etching into dielectric layer 16. The etching of dielectric layer 16 exposes the surface of the substrate 12. The etching of the dielectric layers 20 and 16 and conductive layer 18 results in an opening that is self-aligned to the mask opening. The opening is sometimes referred to as a device opening due to the fact that the opening is used to form transistor devices. It should be noted that nonselective etches and multiple etch processing steps are possible for the formation of the device opening.

The diffusion 14 is formed in one of at least two ways. In one form, the diffusion 14 can be implanted or diffused into the substrate selectively through the use of one of a photoresist mask, an oxide mask, a nitride mask or the like. Diffusion 14, in a similar manner, can be implanted through an oxide or like material to ensure a shallow, dopant-dispersed junction. This implantation or diffusion occurs before the formation of the conductive layer 18. In a second method, the diffusion 14 can be implanted or diffused after the formation of the device opening. The second method, when using implantation, is preferred due to the fact that the resulting diffusion 14 is self-aligned to the device opening. The opening can be of any geometry or size but is preferably a contact of minimum lithographic size.

Figure 2:
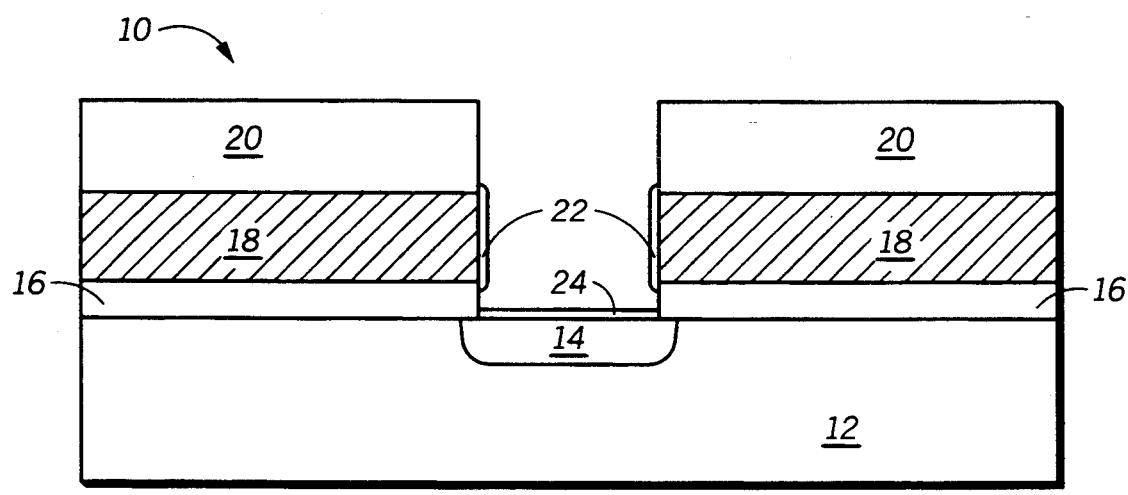

FIG. 2 illustrates a sidewall dielectric layer 22 formation step. A sidewall dielectric layer 22 is formed on a sidewall of the conductive layer 18 that results from the formation of the opening. Due to the fact that the dielectric functions as a gate oxide, the dielectric layer 22 is in most cases a grown $SiO_2$ layer. The growth of dielectric layer 22 will result in a thin dielectric layer 24 being grown on the exposed surface of the diffusion 14. In another form, the dielectric layer 22 could be formed via deposition or spacer technology.

Figure 3:
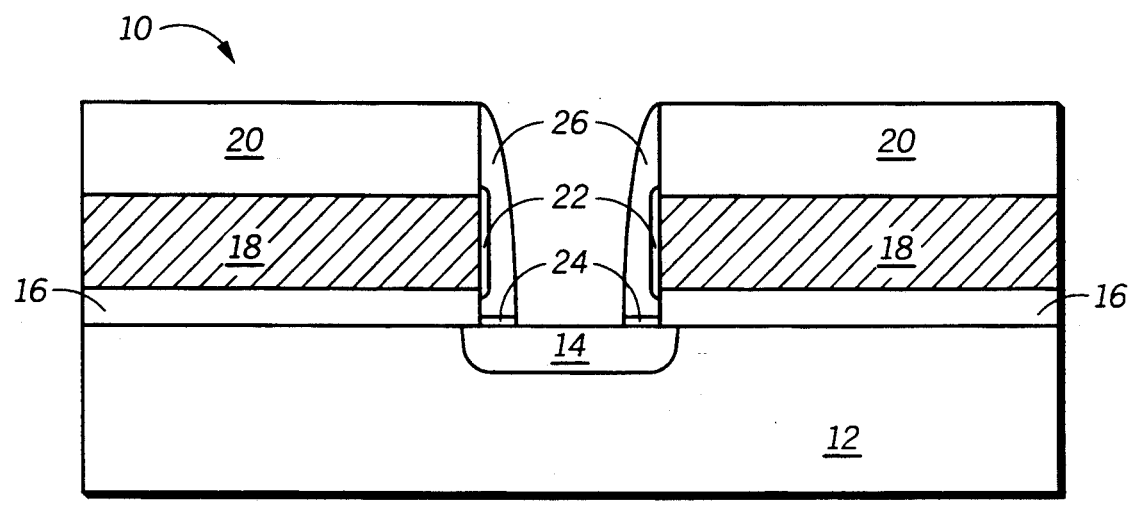

The formation of the dielectric layer 24 is a side-effect that is undesirable. Therefore, FIG. 3 illustrates a dielectric removal step for a portion of the dielectric layer 24. A spacer 26 or like formation is formed overlying the dielectric layer 24 and adjacent the dielectric layer 22. Preferably, the spacer 26 is nitride. The spacer 26 is formed within the device opening adjacent a device opening sidewall to form an inner opening. The spacer 26 is used to protect the dielectric layer 22 from subsequent oxide etching. An oxide etch is then performed selective to nitride and substrate 12. The oxide etch removes a portion of dielectric layer 24 that lies within an inner portion of the device opening. The inner portion of the device openings is defined by the dielectric spacer 26. A portion of the dielectric layer 24 which underlies the spacer and surrounds a periphery of the opening remains unetched. The spacer 26 is removed via conventional nitride or removable spacer techniques. Optionally, the spacer 26 is left on the sidewall and functions as a sidewall gate dielectric.

Figure 4:
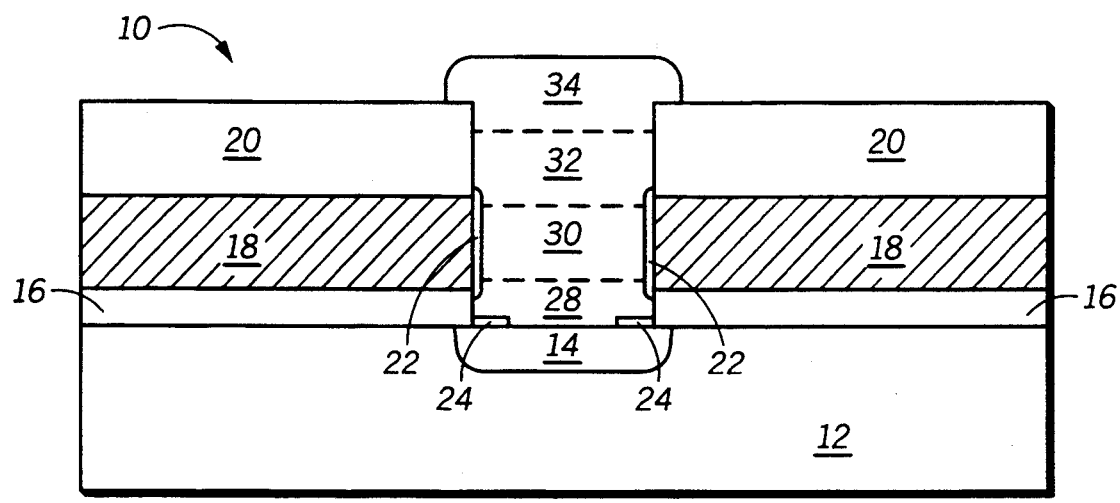

In FIG. 4, first and second current electrodes, also respectively referred to as a drain and a source, and a channel region are formed. In a preferred form, a grown conductive region is used to form the first and second current electrodes and the channel region. Preferably, the grown conductive region is formed via epitaxial growth.

The transistor 10 is placed into a piece of equipment suitable for epitaxial growth. Growth is initiated by heating transistor 10 and subjecting exposed portions of the diffusion 14 or substrate 12 to a chemical compound such as dichloro-silane or a similar silicon source gas.

Initially, a first current electrode or drain electrode 28 is formed in the device opening. Electrode 28 is formed of a second conductivity type that is opposite the first conductivity type. In order to dope the drain electrode 28 with dopant atoms of the second conductivity type, in-situ doping is preferred although ion implantation is possible. In-situ doping means that the drain electrode 28 is doped during growth by a dopant gas source. If the second conductivity type is P type, then a boron-containing gas or a like dopant gas is used to dope drain electrode 28. If the second conductivity type is N type, then a phosphorus-containing, arsenic-containing, or like dopant gas is used to dope drain electrode 28. Drain electrode 28 is grown, with in-situ doping, until the electrode is adjacent or nearly adjacent a bottom portion of the sidewall dielectric 22. Drain electrode 28 is adjacent the first dielectric layer 16 as illustrated in FIG. 4.

Epitaxial growth continues in a similar manner to form a channel region 30. The channel region 30 is formed of the first conductivity type, preferably via in-situ doping as described herein. Due to the fact that dielectric layer 22 is a gate oxide and that conductive layer 18 functions as a gate, the doping in the channel region 30 can be used to adjust threshold voltages. The channel region 30 is grown, with in-situ doping, until the channel region 30 is adjacent or nearly adjacent a top portion of the sidewall dielectric 22 as illustrated in FIG. 4.

Epitaxial growth continues in a similar manner to form a second current electrode, also referred to as a source electrode, of the second conductivity type. The second current electrode has a first sub-region referred to as a lightly doped electrode 32 and a second sub-region referred to as a heavily doped electrode 34. The electrodes 32 and 34 are formed by changing the in-situ doping concentration during growth. Initially, the second conductivity doping gas is at a predetermined concentration. After a predetermined time, and therefore after a predetermined thickness of the lightly doped electrode 32 has been achieved, the dopant concentration is increased to a second predetermined level and epitaxial growth continues to form the heavily doped electrode 34. Electrode 34 is grown, with in-situ doping, until the electrode is level with dielectric layer 20 or growing over dielectric layer 20 as illustrated. A portion of electrode 34 is adjacent the second dielectric layer 20 as illustrated in FIG. 4.

It is advantageous to have a transistor with a half lightly doped drain (LDD) structure as illustrated in FIG. 4. LDD regions result in an increase in series resistance. If an LDD region can be formed only at a source electrode, where the LDD region is most needed, the advantages of the LDD structure are preserved while reducing series resistance. It should be noted that a source and drain region can be interchangeable in the structure of FIG. 4. If the source and drain functionality is switched (i.e. the source is formed underlying the channel region 30 and the drain is formed overlying the channel region 30), an LDD electrode may be formed for the lower drain electrode 28. It is important to note that LDD regions in transistor 10 are optional, and the doping for both the source and the drain regions may be constant with no LDD regions.

It is also important to note that epitaxial growth requires a clean surface, therefore before initiating growth a cleaning cycle, such as a conventional RCA oxidizing clean, an Ishizaka-Shiraki clean, or an equivalent cleaning cycle, is performed. In addition, a thin film transistor (TFT) can be formed by the epitaxial process taught above. If the substrate 12 is polysilicon instead of single crystalline silicon, then polysilicon electrode regions and channel regions are epitaxially grown. This growth forms a vertical TFT that will be similar in structure to the transistor 10 of FIG. 4. A vertical TFT can be helpful in terms of saving area in memory cell designs.

Figure 5:
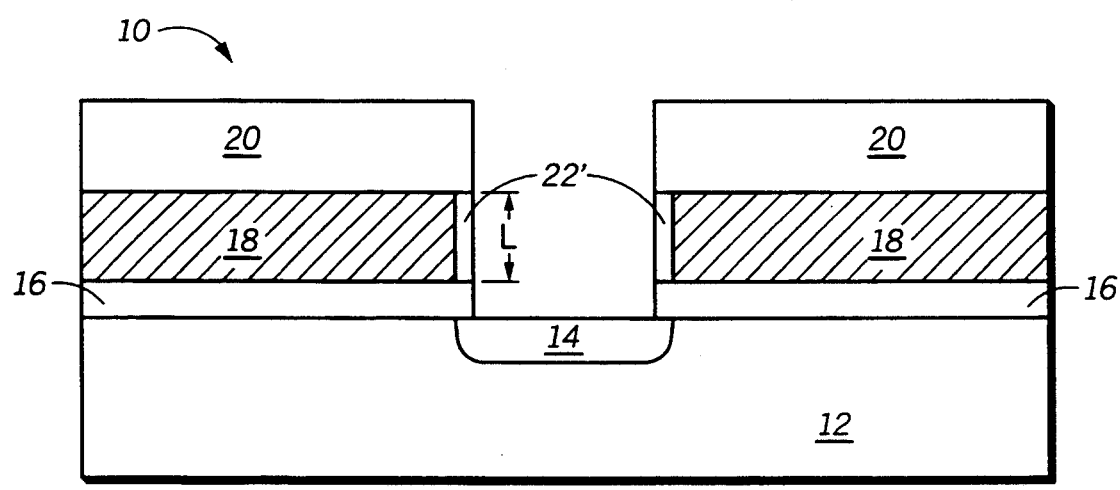
FIG. 5 illustrates, in cross-sectional form, an alternative method of sidewall dielectric formation in accordance with the present invention.

In FIG. 4, the dielectric layer 24 that remains around a periphery of the device opening is not desirable, especially during epitaxial growth. Therefore, FIG. 5 illustrates an alternative method that may be used to replace the steps of FIGS. 2-3. When etching the dielectric layers 16 and 20 and the conductive layer 18 to form the opening, a dielectric layer 20 etch followed by a conductive layer 18 etch, followed by a dielectric layer 16 etch is used to expose the substrate 12 and self-align various features of transistor 10. If during the conductive layer 18 etch an over-etch or isotropic etch is performed, the conductive layer 18 will laterally etch and recess into a "cave" having sides defined by the dielectric layers 16 and 20. With a conductive layer 18 that is recessed from a sidewall of the opening, a dielectric layer 22' can be formed as illustrated in FIG. 5. The formation of the dielectric layer 22' also forms a surface dielectric layer (not illustrated) overlying the diffusion 14. The difference is that a spacer is no longer needed to protect the sidewall dielectric layer 22'. A reactive ion etch (RIE) can be performed to completely remove the surface dielectric layer from the surface of the diffusion 14 without affecting the recessed dielectric layer 22'.

During RIE etching, plasma damage can result in the dielectric layer 22'. Due to the fact that the dielectric layer 22' functions as a gate oxide, dielectric layer 22' must be of excellent quality. Therefore, to avoid or reduce plasma damage during RIE etching, the dielectric layer 22 is nitrided via $N_2$, $N_2O$, $NH_3$, or an equivalent. A nitrided oxide resists plasma damage and is a feasible option for transistor 10.

Both N-channel and P-channel transistors can be formed with the present invention. If the first conductivity is N type and the second conductivity is P type then a P-channel vertical transistor is formed. If the first conductivity is P type and the second conductivity is N type then an N-channel vertical transistor is formed.

Figure 6:
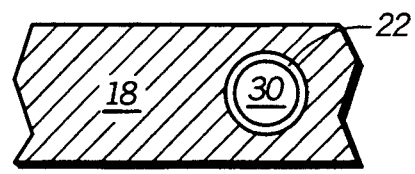
FIG. 6 illustrates, in a top perspective view, a geometry for a control electrode formation in accordance with the present invention.

In most cases, the transistor 10 of FIG. 1 will have a conductive layer 18 that completely surrounds the device opening. A maximum amount of current carrying capability, a more consistent aspect ratio (transistor width/length ratio), and reliable photolithographic alignment results for fully surrounded device openings. In FIG. 6, a top view taken along the horizontal line 1—1 of FIG. 4 is illustrated. Conductive layer 18, dielectric layer 22, and channel region 30 are illustrated. In FIG. 6, the conductive layer 18 is illustrated as completely surrounding the channel region 30. Dielectric layer 22 functions as a gate electrode dielectric.

Figure 7:
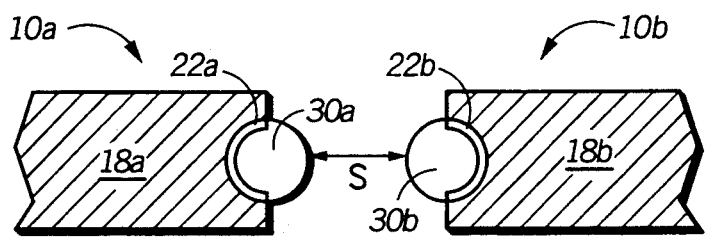
FIG. 7 illustrates, in a top perspective view, an alternative geometry for a control electrode formation in accordance with the present invention.

In many cases, an increased packing density can be achieved by only partially surrounding the channel region 30 with conductive layer 18. An example of this technique is illustrated in FIG. 7 wherein two transistors 10a and 10b are illustrated in a manner analogous to FIG. 6. The two transistors 10a and 10b are positioned at a distance S from each other. If the conductive gates 18a and 18b are formed to respectively completely surround the vertical conductive regions 30a and 30b analogous to FIG. 6, the transistors 10a and 10b would require a separation distance S that is greater than that illustrated in FIG. 7. This larger separation distance S would be needed due to the spacing distances required in most polysilicon design rules. The distance S is reduced in FIG. 7 due to the fact that the the conductive layers 18a and 18b are separated by a greater distance and are not constrained by design rule spacing.

Figure 8:
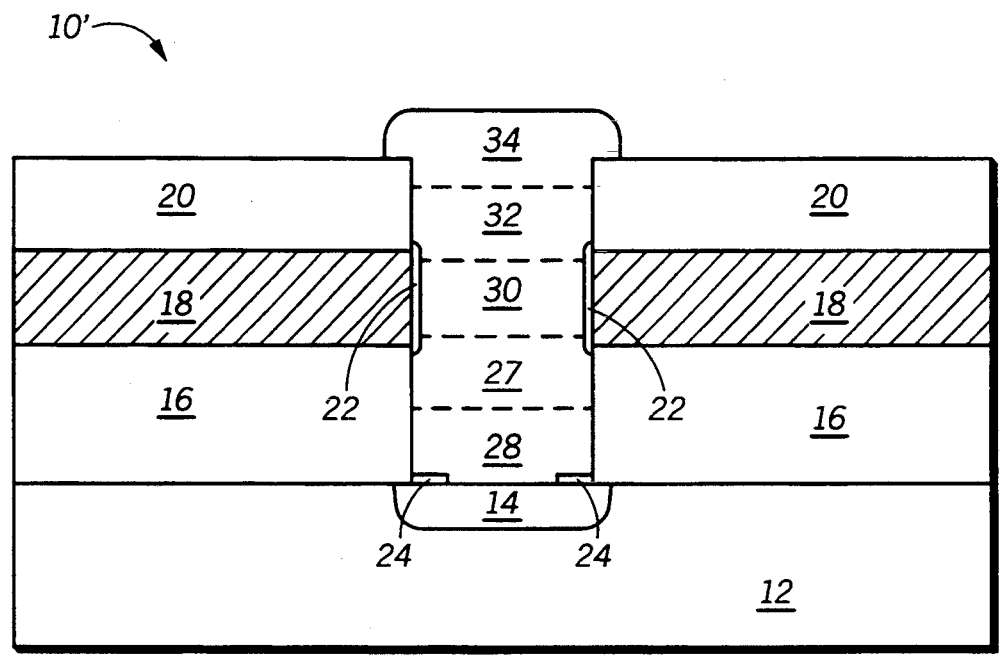
FIG. 8 illustrates, in cross-sectional form, another embodiment of the transistor in accordance with the present invention.

FIG. 8 illustrates a full LDD vertical transistor 10' wherein both the source electrode and the drain electrode are formed with lightly doped electrodes 27 and 32 adjacent the channel region 30 and heavily doped electrodes 28 and 34 adjacent the lightly doped electrodes 27 and 32. Elements which are common between FIG. 8 and FIGS. 1-4 are similarly numbered. The previously discussed method of forming in-situ doped current electrodes and in-situ doped channel regions is described herein. The method of forming the half LDD structure in FIG. 4 and in-situ doping may be used twice to form the transistor 10' of FIG. 8.

Figure 9:
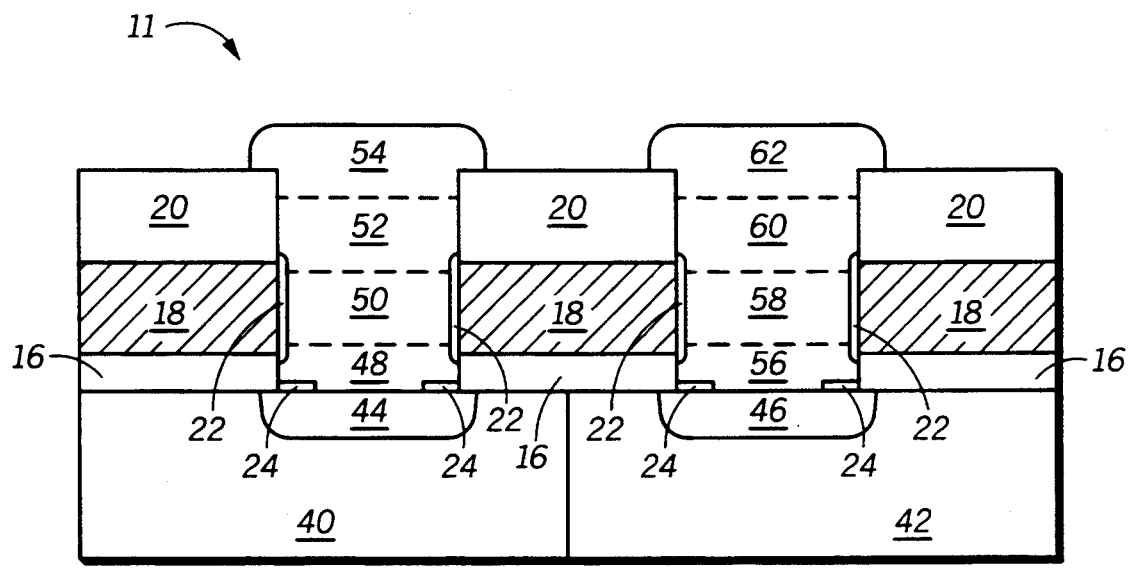
FIG. 9 illustrates, in cross-sectional form, an inverter logic gate formed by two transistors in accordance with present invention.

The transistor 10 or 10' can be used in various applications. In FIG. 9, two vertical transistors are connected to form a CMOS inverter 11. Two well regions are formed. Elements of FIG. 9 that are analogous to elements in previous figures are again identically labeled. A first well 40 of a P conductivity type is formed and a second well 42 is formed of an N conductivity type. The layers 16, 18, and 20 are formed in a manner similar to FIG. 1. Two device openings are etched, diffusions 44 and 46 are independently formed, and sidewall dielectric layers are formed as described herein for transistor 10.

Independently grown conductive regions are formed for the left-side N-channel transistor and the right-side P-channel transistor. Independent formation of P-channel and N-channel devices is necessary because dopant atoms of different conductivities are needed. Overlying diffusion 44 a drain electrode 48, a channel region 50, a lightly doped source electrode 52, and a heavily doped source electrode 54 are formed as described herein while the diffusion 46 is masked via oxide or photoresist. Diffusion 46 is exposed and a drain electrode 56, a channel region 58, a lightly doped source electrode 60, and a heavily doped source electrode 62 are formed as described above. It should be noted that the method and order of forming both of the transistors of inverter 11 may vary. In addition, the source and drain regions can be reversed, thereby turning the inverter 11 upside down but not changing the functionality.

The electrodes 48, 52, and 54 are of an N conductivity type and the channel region 50 is of a P conductivity type. Therefore, the left-most transistor is an N-channel transistor. The electrodes 56, 60, and 62 are of a P conductivity type and the channel region 58 is of an N conductivity type. Therefore, the right-most transistor is a P-channel transistor.

The conductive layer 18 functions as an inverter logic input and therefore functions as a gate for both of the transistors. Electrode 54 is connected to a ground potential via metal, polysilicon, or a like conductor. Electrode 62 is connected to a power supply potential via metal, polysilicon, or a like conductor. The diffusions 44 and 46 are connected together by metal, silicide, or the like and form the output of the inverter 11.

Figure 10:
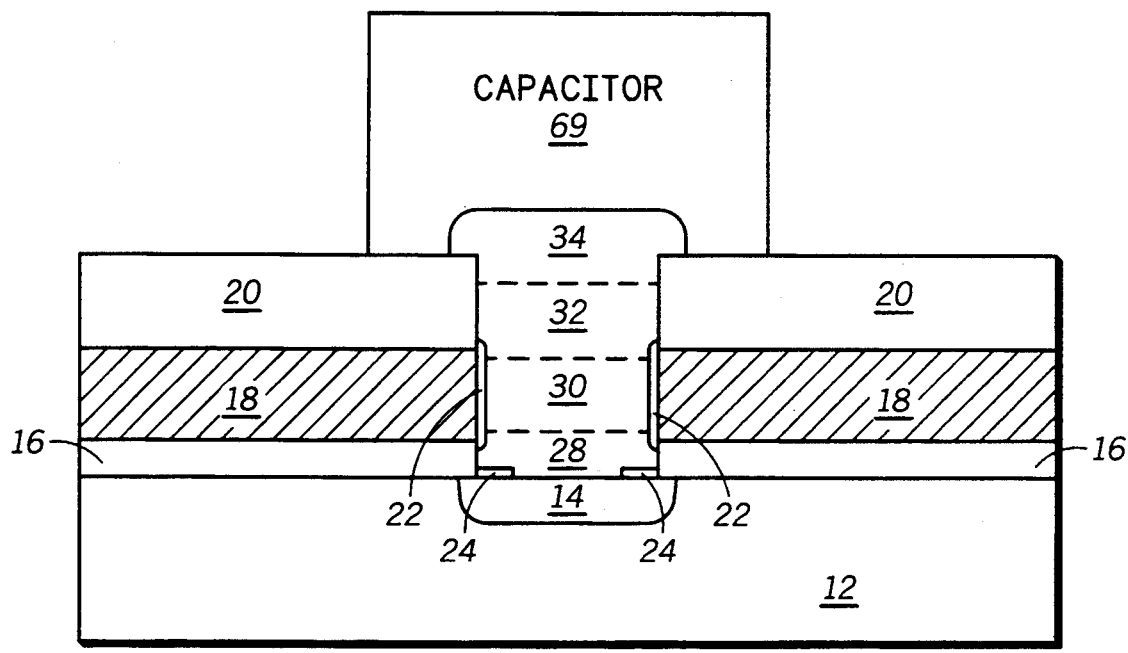
FIG. 10 illustrates, in cross-sectional form, the use of the transistor of FIG. 4 to form a compact DRAM cell.

FIG. 10 illustrates how the transistor of FIG. 4 can be used to form a compact DRAM cell. A capacitor 69, such a parallel plate capacitor, a box capacitor, a fin capacitor, a crown capacitor, or the like, can be placed overlying the vertical transistor of FIG. 4. An electrical contact formed from one of the electrodes of the capacitor to electrode 34 forms an electrical connection between the capacitor 69 and the underlying transistor. The conductive layer 18 is a DRAM word line input of the DRAM cell. In the DRAM cell of FIG. 10, the diffusion 14 is used as a conventional DRAM bit line, and the other electrode of capacitor 69 is connected, as a conventional DRAM cell, to ground.

Figure 11:
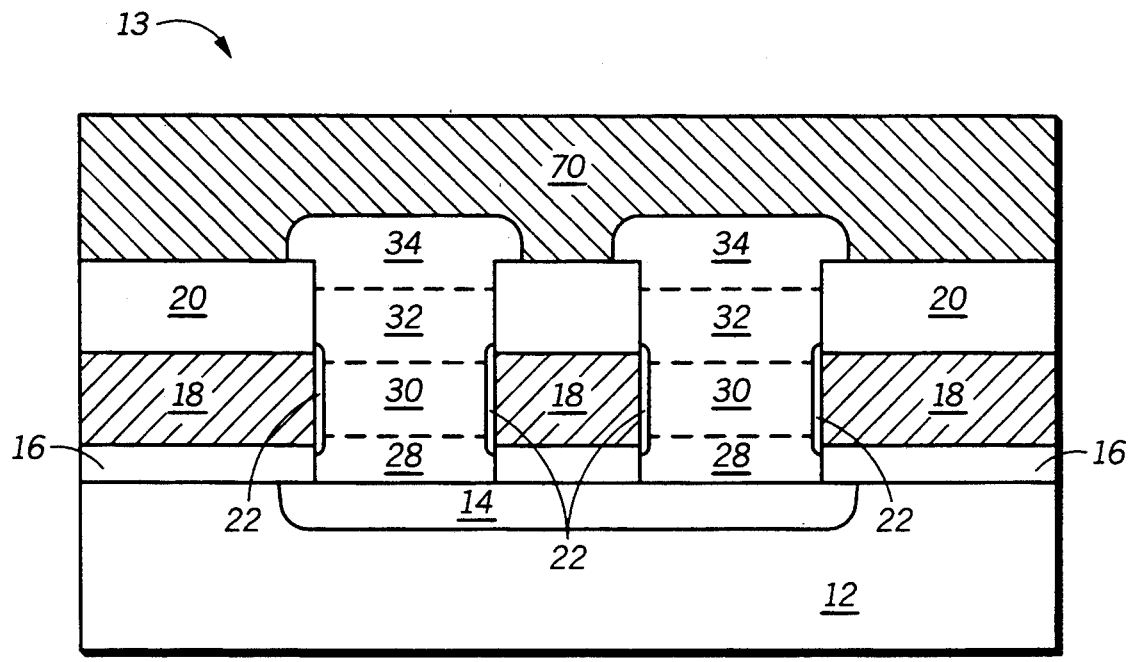
FIG. 11 illustrates, in cross-sectional form, a power transistor formed by a plurality of transistors, each in accordance with the present invention.

Due to the fact that the transistor 10 is formed within a contact hole opening, the current carrying capability of the transistor 10 is limited. To enhance the current carrying capability for power devices and the like without increasing the contact hole size, a power transistor 13 illustrated in FIG. 11 may be used. It is useful to maintain a small contact hole size and use several transistors in parallel to form a power device. The method described herein ensures that the transistors are fully depleted devices and therefore have reduced short channel behavior. FIG. 11 illustrates a cross section of a power transistor formed from two transistors while FIG. 12 illustrates the three dimensional nature of a power transistor 15 formed from four transistors.

To form the power transistor of FIG. 11, a plurality of transistors or M transistors is formed overlying the substrate in accordance with the methods presented herein. M is a fixed integer value which is greater than one. All M transistors are of the same conductivity type, either N or P-channel transistors. FIG. 11 illustrates a case wherein M=2. A conductive layer 70 connects all of the source electrodes 34 of the M transistors together. A diffusion connection region referred to as diffusion 14 connects each of the drain electrodes 28 of the M transistors to each other. The resulting device is a power device that is essentially M transistors connected in parallel that function as a single power transistor.

Figure 12:
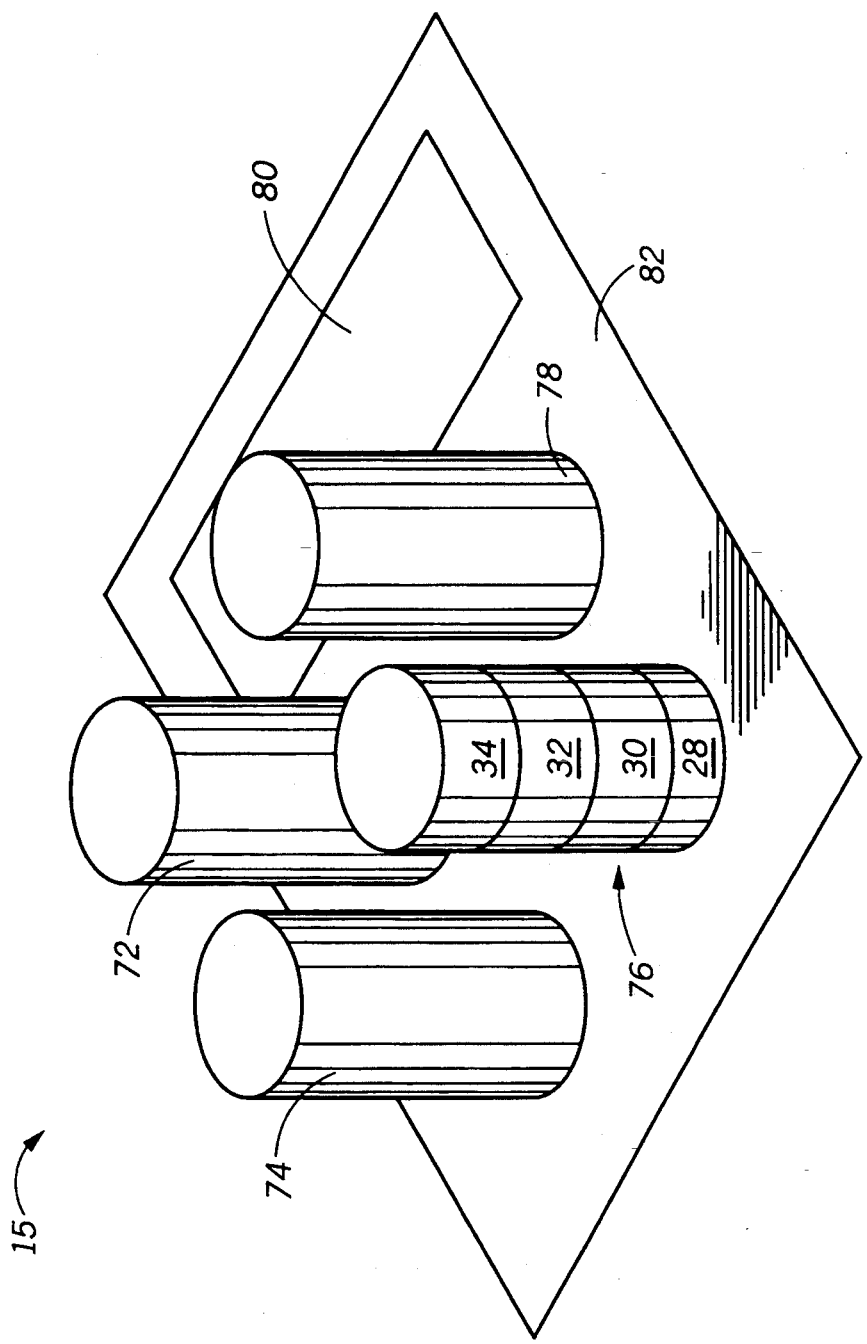
FIG. 12 illustrates a three dimensional perspective view of a power transistor formed by a plurality of transistors, each in accordance with the present invention.

FIG. 12 illustrates in a three dimensional view the three dimensional nature of the power transistor 15 where M=4. Therefore, four transistors 72, 74, 76, and 78 are formed overlying a substrate 82 in accordance with the methods described herein. The transistor 76 illustrates the lightly doped electrode 32, the heavily doped electrode 34, the channel region 30, and the drain electrode 28 of previous figures in a three dimensional manner. Each of the four transistors of FIG. 12 have electrodes 28, 32, and 34 and a channel region 30. An underlying diffusion (not illustrated) connects the M transistor drain electrodes together and is connected to an overlying conductive layer (not illustrated) via a diffusion contact opening 80. The tops of the vertical transistors 72, 74, 76, and 78 are connected by a conductive layer (not illustrated) as illustrated in FIG. 11. A single power transistor with the current carrying capability of roughly four times that of the single transistor 10 is formed.

The inventive methods and devices presented herein provide a vertical transistor and vertical transistor applications that have reduced surface area, improved short channel behavior, and reduced channel length variation. Leakage current is reduced due to the fact that the second current electrodes and the channel regions are isolated from the substrate. A length of the transistor 10 is controlled by a conductive layer 18 deposition thickness L illustrated in FIG. 1. The deposition thickness L of the control electrode ensures that channel length will be independent from lithography, smaller than lithography allows, and controlled within a smaller variation. The channel width of the transistor 10 is larger than planar transistors of the same surface area due to the fact that the channel width of a cylindrical transistor is the cylinder's circumference. Due to the smaller channel length and the greater channel width, the current carrying capability of the inventive transistor increases without increasing transistor surface area. In many cases, transistor substrate surface area will decrease when using the inventive transistor.

The transistor taught herein is formed within a contact which is lithographically the smallest feature size in an integrated circuit. In addition, the formation requires only one photolithography step and many features of the inventive transistor can be self-aligned. Asymmetric source and drain electrodes result and LDD and half LDD transistors are easily formed. Bulk inversion of the channel region can be achieved for small channel region circumferences. Low off current results and leakage to the substrate is minimized due to the fact that many diffusions are placed in series and isolated from the substrate.

In some cases, transistor 10 may be formed in an opening that is too large to fully deplete. Fully deplete means that when transistor 10 is "on" or is conducting current, the channel region is depleted in mobile charge concentration. Mobile charges are negatively-charged electrons or positively-charged holes. Channel depletion is desirable for improved performance. If a sidewall contact is made to the transistor 10 channel region and the sidewall contact is connected to the substrate or a power supply, depending on device conductivity type, a greater level of depletion can be achieved. This sidewall contact connection is possible for a transistor designed in a manner similar to either transistor 10a or transistor 10b in FIG. 7. Due to the partially surrounding gate structure of the transistors 10a and 10b of FIG. 7, a channel contact can be made and depletion will be improved.

While the present invention has been illustrated and described with reference to specific embodiments, further modifications and improvements will occur to those skilled in the art. For example, epitaxial growth methods vary in temperature, doping mechanisms, length of time, procedures, and chemistry, and most of these epitaxial processes are capable of forming the source and drain electrodes and channel regions of the inventive device. Many applications exist for the inventive transistor. Many cleaning cycles exist for implementing the described epitaxial growth procedures. Sidewall dielectrics can be formed in one of several ways and may even be used as sidewall gate dielectrics. Two sidewall dielectric formation alternatives are presented herein. Both N-channel and P-channel devices can be manufactured with the inventive process. It is to be understood, therefore, that this invention is not limited to the particular forms illustrated and that it is intended in the appended claims to cover all modifications that do not depart from the spirit and scope of this invention.

We claim:

1. A method for forming a vertically integrated dynamic random access memory cell, the method comprising the steps of:

providing a substrate having a surface and being of a first conductivity type;

forming a first dielectric layer overlying the substrate;

forming a control electrode conductive layer overlying the first dielectric layer;

forming a second dielectric layer overlying the control electrode conductive layer;

sequentially removing portions of each of the second dielectric layer, the control electrode conductive layer, and the first dielectric layer, the sequential removing forming an opening which exposes the surface of the substrate and forming a sidewall of the control electrode conductive layer;

forming a sidewall dielectric laterally adjacent the sidewall of the control electrode conductive layer;

forming a conductive region within the opening, the conductive region having a first portion of a second conductivity type which functions as a first current electrode, the first portion being laterally adjacent the first dielectric layer and overlying the substrate, the conductive region having a second portion of the first conductivity type functioning as a channel region, the second portion being adjacent the sidewall dielectric, and overlying the first current electrode, and the conductive region having a third portion of the second conductivity type functioning as a second current electrode, the third portion being adjacent the second dielectric layer and overlying the channel region; and forming a capacitor overlying the conductive region wherein the capacitor has both a first capacitor electrode coupled to the second current electrode of the conductive region and a second capacitor electrode for receiving a voltage supply potential.

2. A method for forming both a transistor and a capacitor, the method comprising the steps of:

providing a silicon substrate having a surface and being of a first conductivity type;

forming a first dielectric layer overlying the silicon substrate;

depositing a control electrode polysilicon layer overlying the first dielectric layer;

depositing a second dielectric layer overlying the control electrode polysilicon layer;

sequentially removing portions of each of the second dielectric layer, the control electrode polysilicon layer, and the first dielectric layer, the sequential removing forming an opening which exposes the surface of the silicon substrate and forming a sidewall of the control electrode polysilicon layer;

growing a sidewall oxide laterally adjacent the sidewall of the control electrode polysilicon layer;

growing an epitaxial region within the opening, the epitaxial region having a first portion of a second conductivity type which functions as a first current electrode, the first portion being laterally adjacent the first dielectric layer and overlying the silicon substrate, the epitaxial region having a second portion of the first conductivity type functioning as a channel region, the second portion being laterally adjacent the sidewall oxide, and overlying the first current electrode, and the epitaxial region having a third portion of the second conductivity type functioning as a second current electrode, the third portion being laterally adjacent the second dielectric layer and overlying the channel region; and forming a capacitor overlying the epitaxial region wherein the capacitor has both a first capacitor electrode coupled to the second current electrode of the transistor and a second capacitor electrode for receiving a voltage supply potential.

3. A method for forming a dynamic memory cell comprising the steps of:

providing a semiconductive substrate having a surface;

forming a conductive diffusion region within the semiconductive substrate;

forming a transistor overlying the surface of the substrate, the transistor having a second current electrode that substantially directly overlies a first current electrode where the first and second current electrodes are separated by a channel region, the transistor having a gate electrode which controls current flow through the channel region, the first current electrode overlying and being coupled to the conductive diffusion region where the channel region is physically separated from the semiconductive substrate via the first current electrode; and forming a capacitor directly overlying the transistor, the capacitor having a first electrode and a second electrode wherein the first electrode of the capacitor is electrically coupled to the second current electrode of the transistor.

4. The method of claim 3 wherein the step of forming the transistor further comprises the steps of:

forming a first dielectric layer overlying the substrate and providing a first portion of an opening;

forming a control electrode conductive layer overlying the first dielectric layer and providing a second portion of the opening which forms a sidewall of the control electrode conductive layer, the control electrode conductive layer being used to form the gate electrode;

forming a second dielectric layer overlying the control electrode conductive layer and providing a third portion of the opening, the first, second, and third portions of the opening forming a device opening that exposes the conductive diffusion region;

forming a sidewall dielectric adjacent-the sidewall of the control electrode conductive layer;

forming the first current electrode within said device opening, adjacent the first dielectric layer, and overlying the substrate, the first current electrode having a first conductivity type;

forming the channel region adjacent the sidewall dielectric and overlying the first current electrode, the channel region having a second conductivity type; and forming the second current electrode adjacent the second dielectric layer and overlying the channel region, the second current electrode having the first conductivity type.

5. The method of claim 4 wherein the step of forming the control electrode conductive layer further comprises:

laterally recessing the sidewall of the control electrode conductive region laterally outward from a center of the device opening.

6. The method of claim 4 wherein the step of forming a conductive diffusion region further comprises:

forming the conductive diffusion region via an ion implantation process where the diffusion region is self-aligned to said device opening, lying within the substrate, and exposed at the surface of the substrate.

7. The method of claim 4 wherein the step of forming the transistor further comprises the step of:

forming a heavily doped sub-region adjacent a lightly doped sub-region, the lightly doped sub-region being adjacent the channel region, the heavily doped sub-region and the lightly doped sub-region forming one of either said first current electrode or second current electrode of the transistor.

8. The method of claim 4 wherein the step of forming the transistor further comprises the steps of:

forming a first heavily doped sub-region adjacent a first lightly doped sub-region, the first lightly doped sub-region being adjacent the channel region, the first heavily doped sub-region and the first lightly doped sub-region being used to form said first current electrode of the transistor; and forming a second heavily doped sub-region adjacent a second lightly doped sub-region, the second lightly doped sub-region being adjacent the channel region, the second heavily doped sub-region and the second lightly doped sub-region being used to form said second current electrode of the transistor.

9. The method of claim 4 wherein the step of forming the control electrode conductive layer further comprises:

forming the control electrode conductive layer laterally surrounding a portion of a perimeter of the device opening.

10. The method of claim 3 wherein the step of forming the capacitor further comprises:

forming the capacitor as a single capacitor selected from a group consisting of a parallel plate capacitor, a box capacitor, a fin capacitor, and a crown capacitor.

11. The method of claim I wherein the voltage supply potential is a ground supply potential.

12. The method of claim 2 wherein the voltage supply potential is a ground supply potential.

13. A method for forming a dynamic random access memory comprising the steps of:

providing a semiconductor substrate having a top surface;

forming a conductive bit line within the substrate;

forming a transistor overlying the top surface of the substrate and being coupled electrically to the conductive bit line, the transistor having a first current electrode, a second current electrode overlying the first current electrode, a channel region separating the first and second current electrodes where the channel region is structurally isolated from the substrate via the first current electrode, and a gate electrode adjacent the channel region to control current flow therethrough; and forming a capacitor overlying the transistor, the capacitor having a first capacitor electrode coupled to the second current electrode of the transistor.

14. The method of claim 13 wherein the first current electrode, the second current electrode and the channel region of the transistor are made of epitaxial material and are used to read electrical charge stored by the capacitor by selectively providing a conductive path for electrical current to flow from the capacitor.

15. The method of claim 13 wherein the transistor has a current flow which is substantially perpendicular to the top surface of the substrate, the gate electrode being laterally adjacent the channel region and being separated from the gate electrode by a gate dielectric region.

16. The method of claim 13 wherein a lightly doped drain (LDD) region is formed laterally adjacent the first current electrode of the transistor.

17. The method of claim 13 wherein a lightly doped drain (LDD) region is formed laterally adjacent the second current electrode of the transistor.

18. The method of claim 13 wherein a lightly doped drain (LDD) region is formed laterally adjacent the second current electrode of the transistor and a lightly doped drain (LDD) region is formed laterally adjacent the first current electrode of the transistor.

19. The method of claim 13 wherein the conductive bit line is a diffusion region formed within the substrate and exposed at the top surface of the substrate.

* * * * *